United States Patent [19]

Hiramoto et al.

[11] Patent Number: 4,902,921
[45] Date of Patent: Feb. 20, 1990

[54] DRIVE CIRCUIT FOR DRIVING CASCODE BIPOLAR-MOS CIRCUIT

[75] Inventors: Takahiro Hiramoto, Itami; Gourab Majumdar, both of Itami, Japan

[73] Assignee: Mitsubishi Denki Kabushiki Kaisha, Tokyo, Japan

[21] Appl. No.: 195,286

[22] Filed: May 17, 1988

[51] Int. Cl.[4] .................. H03K 17/04; H03K 17/56
[52] U.S. Cl. .................. 307/570; 307/300; 307/315
[58] Field of Search .......... 307/571, 254, 315, 300, 307/570

[56] References Cited

FOREIGN PATENT DOCUMENTS 3124891  6/1985  Fed. Rep. of Germany.
3321107  6/1985  Fed. Rep. of Germany.
0296818  12/1986  Japan ................................ 307/570

OTHER PUBLICATIONS

"Bipolar-FET Combinational Power Transistors for Power Conversion Applications," Dan Y. Chen and Shaoan A. Chin, CH1855-6/1983, IEEE, pp. 514–519.
"A New 100A, 1000V Dual Cascode BIMOS Power Module for High Power and High Frequency Inverter Applications," Y. Kamitani, G. Majumdar, H. Yamaguchi and S. Mori, PCI, Oct. 1986, Proceedings, pp. 143–154.
International Rectifier, HEXFET Databook, 1985 Third Edition, pp. A125 and A128.
International Rectifier, HEXFET Designers's Manual, 1987 Fourth Edition, "High Voltage, High Frequency Switching . . . ", pp. I99–I101.
Bipolar und MOSFET als Kaskade, Dec. 1982, Markt & Technik, Nr. 48, Vom 3, pp. 66–68.

Primary Examiner—John Zazworsky
Attorney, Agent, or Firm—Oblon, Spivak, McClelland, Maier & Neustadt

[57] ABSTRACT

The drive circuit for driving a cascode bipolar MOS circuit (1) has a bipolar transistor (21) coupled to a bipolar transistor (11) in the bipolar MOS circuit (1) through a Darlington connection. A base current for the bipolar transistor (11) is supplied through the other bipolar transistor (21), without a transformer.

4 Claims, 2 Drawing Sheets

DRIVE CIRCUIT FOR DRIVING CASCODE BIPOLAR-MOS CIRCUIT

BACKGROUND OF THE INVENTION

1. Field of the Invention

The present invention relates to a power semiconductor device employed in a frequency converter such as a DC-AC inverter or the like, and more particularly, it relates to a drive circuit for driving a cascode bipolar-MOS circuit (hereinafter referred as "BiMOS").

2. Description of Background Arts

FIG. 1 shows a conventional drive circuit for driving a cascode BiMOS 1 in which a bipolar transistor 11 and a power MOSFET 12 are coupled to each other through a cascode connection. A diode 13 is provided in anti-parallel to the cascode connection, to serve as a bypass when a reverse current is supplied to the cascode BiMOS 1. Between the base of the bipolar transistor 11 and the source of the MOSFET 12, a Zener diode 2 is inserted so that the anode of the Zener diode 2 is connected to the source of the MOSFET 12. A capacitor 3 is connected to the Zener diode 2 in parallel. A signal source 4 generates a control signal which is delivered to the gate of the MOSFET 12. A power for driving the signal source 4 is supplied from a power source 5. Another power source 6 is inserted between the signal source 4 and the source of the MOSFET 12, to apply a constant voltage level to the source of MOSFET 12 and the other elements connected thereto. The cascode BiMOS 1 is inserted in a current path CP fromed as a current line, and the current path CP can be opened or closed through a switching operation in the cascode BiMOS 1. The current pass CP is connected a power source (not shown) at the exterior of FIG. 1.

A current transformer 7 having terminals T1 to T4 is also inserted in the current path CP so that the terminals T4 and T3 of an internal current line L are connected to the current path CP and the cascode BiMOS 1, respectively. Within the other terminals T1 and T2, the hot terminal T1 is connected to the source of the MOSFET 12, and the cold terminal T2 is coupled to the base of the bipolar transistor 11 through a diode 8 and a resistance 9.

When the control signal is generated in the signal generator 4 to be given to the gate of the power MOSFET 12, the MOSFET 12 is turned on. The capacitor 3 is previously charged through a prior ON/OFF cycle of the drive circuit. In response to the turning-on of the MOSFET 12, the emitter voltage of the bipolar transistor 11 is dropped, so that the capacitor 3 is discharged through the bipolar transistor 11 and the MOSFET 12. Accordingly, the collector current of the bipolar transistor 11 begins to flow through the current path CP, to induce a secondary current in the current transformer 7. The secondary current is delivered to the base of the bipolar transistor 11 through the diode 8 and the resistance 9, to serve as the base current required to maintain the turning-on state of the bipolar transistor 11. Therefore, the cascode BiMOS 1 closes the current path CP to allow a stationary current to flow along the current path CP.

Then, the control signal source stops to deliver the control signal, so that the power MOSFET 12 is turned off to force the bipolar transistor into an emitter cut off state. The collector current of the bipolar transistor 11 changes its pass, to flow through the base of the bipolar transistor 11 and the Zener diode 2 while bypassing the MOSFET 12. The bypass current serves as an inverse base current to disenable the bipolar transistor 11, and the bipolar transistor 11 is turned off soon. Accordingly, the cascade BiMOS 13 opens the current path CP to inhibit a current from flowing along the current path CP. The capacitor 3 is again charged through the present ON/OFF operation cycle of the drive circuit for the next operation cycle.

Through the above described operation, the cascode BiMOS 1 is driven so as to control the current passing through the current path CP in response to the control signal. In place of the current transformer 7, an ordinary transformer 10 shown in FIG. 2 may be employed, where the terminals T1 and T4 are replaced with terminals T5 to T8, respectively.

In the conventional drive circuit, the current transformer 7 or the transformer 10 is employed to supply the base current to the bipolar transistor 11, so that the size of and the power loss in a device employing the circuit shown in FIG. 1 are large, and the switching speed in the driving operation is low. Further, the character of the device such as a duty ratio depends on the intrinsic character of the transformer 7 to 10, and the degree of freedom in the design of the device is considarably limited.

SUMMARY OF THE INVENTION

The present invention is intended to a drive circuit for driving a cascode bipolar-MOS circuit having a first bipolar transistor and a MOS transistor coupled to each other through a cascode connection, said bipolar-MOS circuit being inserted in an current path to open and close said current path in response to a control signal supplied from the exterior of the cascode bipolar-MOS circuit to a gate of the MOS transistor.

According to the present invention, the drive circuit comprises a second bipolar transistor coupled to the first bipolar transistor through a Darlington connection; current supply circuit coupled to a base of the second bipolar transistor for supplying a base current to the base of the second bipolar transistor; a diode inserted between the base of the second bipolar transistor and a base of the first bipolar transistor for allowing a current to pass through the diode only in a direction from the base of the first bipolar transistor to the base of the second bipolar transistor; and a Zener diode having a cathode coupled to the base of the second bipolar transistor and an anode coupled to a source electrode of the MOS transistor.

Preferably, the drive circuit further comprises a capacitor inserted between the base of the first bipolar transistor and the source electrode.

In an aspect of the present invention, the first and second bipolar transistor are npn transistors, respective collectors of the first and second bipolar transistor are connected with each other, and an emitter of the second bipolar transistor is connected with the base of the first bipolar transistor.

The first bipolar transistor included in the BiMOS is driven through the second bipolar transistor, which is provided in place of the transformer in the conventional drive circuit, and a device employing the present drive circuit is small in size and in power loss, since, in general, a transistor is small in size and it operates with a small current. No reactance is required according to the present invention, and therefore, the switching speed in the device is improved. These desirable characters of the drive circuit contribute to the improvement in the total character of a device employing the same.

Accordingly, an object of the present invention is to provide a drive circuit for driving a cascode BiMOS whose size is small.

Another object of the present invention is to decrease a power loss in the drive circuit.

Further another object is to improve the drive switching speed in the drive circuit.

Further another object is to increase the degree of freedom in a design of a device employing the drive circuit, by eliminating a transformer from the drive circuit.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
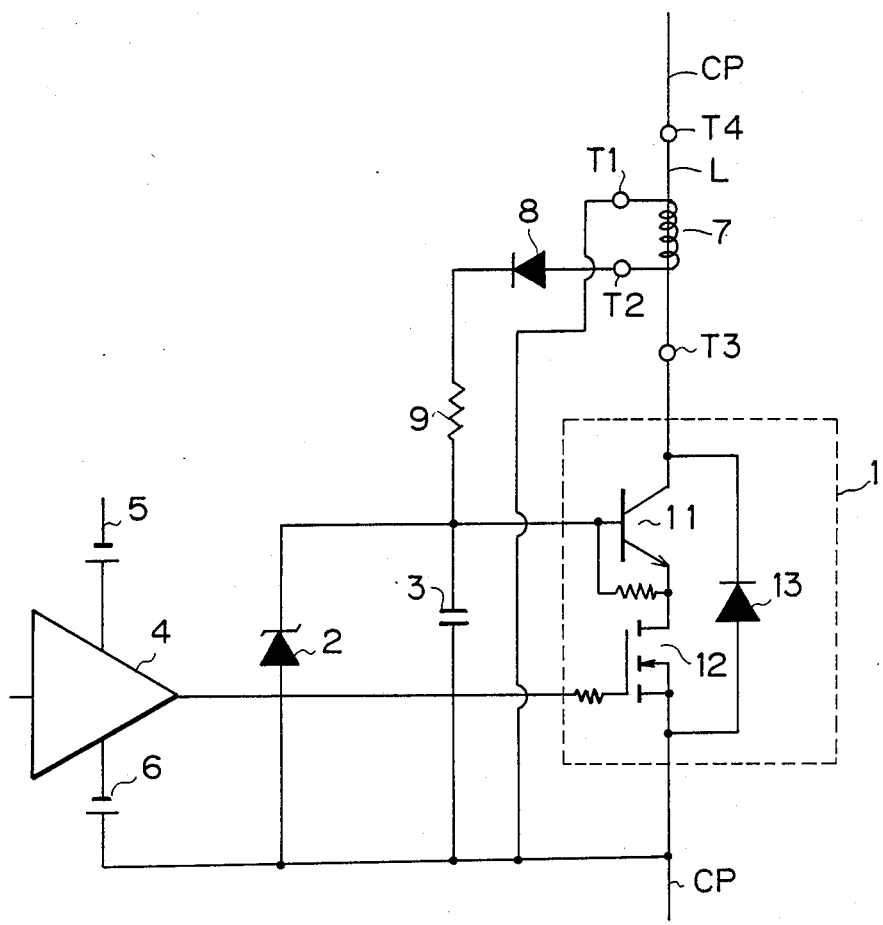
FIG. 1 is a circuit diagram showing a conventional BiMOS drive circuit.
Figure 3:
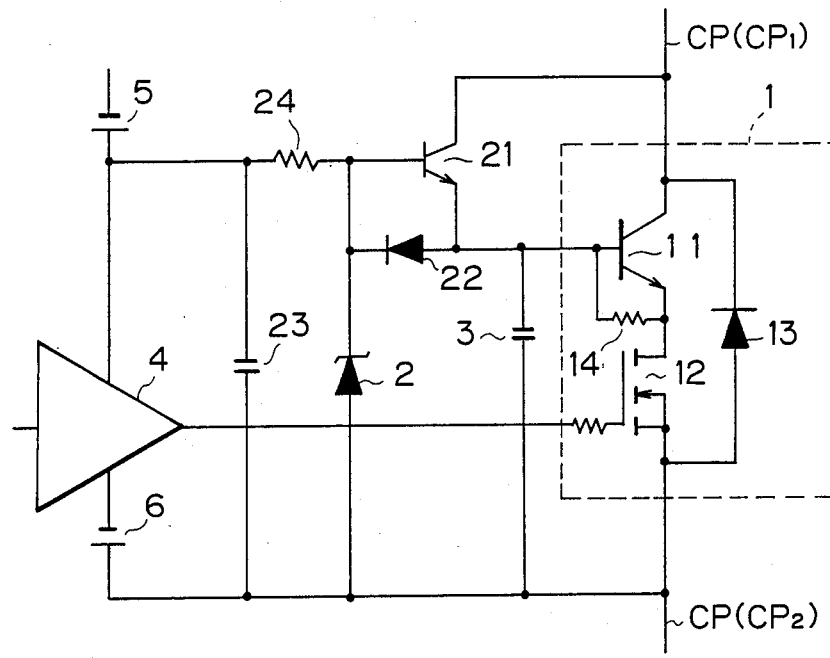
FIG. 3 is a circuit diagram showing a BiMOS drive circuit according to a preferred embodiment of the present invention.
Figure 2:
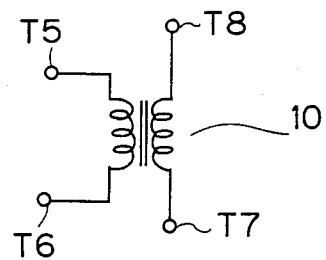
FIG. 2 is a diagram showing a transformer employed in the conventional BiMOS drive circuit.

A BiMOS drive circuit according to a preferred embodiment of the present invention is shown in FIG. 3. A cascode bipolar-MOS circuit (BiMOS) 1 has an npn bipolar transistor 11 and an n-channel power MOSFET 12 coupled with each other through a cascade connection. Between the emitter and the base of the bipolar transistor 11, a resistance 14 is inserted. In anti-parallel to the serially connected transistors 11 and 12, a diode 13 is provided as a reverse current bypass. The cascade BiMOS 1 is inserted in a current path CP to open and close the current pass CP in response to a control signal supplied from a control signal source 4 to the gate of the power MOSFET 12. The current path CP may be an electrical wire. For driving the bipolar transistor 11, another npn bipolar transistor 21 is coupled to the bipolar transistor 11 through a Darlington connection. The emiter of the bipolar transistor 21 is connected to the base of the bipolar transistor 11, and respective collectors of the bipolar transistor 21 and 11 are connected with each other. A pn junction diode 22 is inserted between respective bases of the transistors 21 and 11 so that the anode and the cathode of the diode 22 are connected to the bases of the bipolar transistors 11 and 21, respectively.

A base current of the bipolar transistor 21 in its stationary turning-on state is supplied from a power source 5 through a resistance 24. The power source 5 is also connected to the signal source 4 for supplying a power thereto. Another power source 6 is inserted between the signal source 4 and the source of the MOSFET 12. A capacitor 23 is inserted between respective anodes of the power sources 5 and 6. The cathod of a Zener diode 2 is connected to the base of the bipolar transistor 21, and the anode of the Zener diode 2 is connected to the source of the MOSFET 12 which is coupled to the current path CP in the opposite side to the bipolar transistor 11. Between the base of the bipolar transistor 11 and the anode of the source of the MOSFET 12, another capacitor 3 is inserted.

The operation of the BiMOS device circuit will be described below:

Under the condition where a positive voltage is applied from a power source (not show) to the upper part $CP_1$ of the current path CP in FIG. 3 which is connected to the collector of the bipolar transistor 11, the control signal is generated in the signal source 4 to be delivered to the gate of the power MOSFET 12. The control signal may be generated in response to an input signal given to the signal source 4 from the exterior of the circuit shown in FIG. 3. Accordingly, the power MOSFET 12 is turned on, and the base-emitter junction in the bipolar transistor 11 is forward biased by the voltage across the capacitor 3 which is previously charged in the prior operation cycle of the drive circuit. Therefore, the charge in the capacitor 3 is discharged through the parallel circuit consisting of the resistance 14 and the base-emitter junction of the bipolar transistor 11 to give an over shoot base current to the bipolar transistor 11, and the bipolar transistor 11 is turned on. The discharge in the capacitor 3 brings a voltage drop to the emitter of the bipolar transistor 21, and the charge previously stored in the capacitor 23 by the voltage between the power source 5 and 6 is discharged through the base-emitter junction in the bipolar transistor 21. The discharge current serves as an over shoot base current of the bipolar transistor 21, to let the bipolar transistor 21 turn on. A current supplied from the power source 5 through the resistance 24 serves as a stationary base current of the bipolar transistor 21.

A collector current for the bipolar transistor 21 is supplied from the upper stream side $CP_1$ of the current path CP. An emitter current of the bipolar transistor 21 serves as a base current of the bipolar transistor 11, to maintain the bipolar transistor 11 at its stationary conductive state. As the result, the current path CP is closed in the cascode BiMOS 1, and a stationary current flows along the current path CP through the cascode BiMOS 1 in the direction from the upper stream side $CP_1$ to the down stream side $CP_2$. The capacitors 23 and 3 are again charged by the current supplied from the power source 5 and the emitter current of the transistor 21, respectively.

When the supply of the control signal to the gate of the power MOSFET is stopped, i.e., the voltage level of the gate is lowered, the power MOSFET 12 turns off. Accordingly, the bipolar transistor 11 is formed into an emitter cut off state, and the collector current of the bipolar transistor 11 changes its path, to be delivered from the base of the bipolar transistor 11 to the node between the diode 22 and the emitter of the bipolar transistor 21. Since the diode 22 is in forward direction with respect to the delivered current, the current flows through the diode 22 and the Zener diode 2, to reach the downstream side $CP_2$ (lower side in FIG. 3) of the current path CP. In other words, the collector current of the bipolar transistor 11 bypasses the power MOSFET 12 through the diode 22 and the Zener diode 2, to be delivered to the downstream side $CP_2$ of the current path CP.

The current above described serves as a reverse current for the bipolar transistor 11, to force the bipolar transistor 11 to turn off. Accordingly, the other bipolar transistor 21 is also forced into a partial emitter cut off state as well as a base-emitter reverse biased state by one diode forward drop (diode 22)"; and the collector current thereof changes its path to flow through the base of the bipolar transistor 21 and the Zener diode 2. Therefore, the collector current of the bipolar transistor 21 bypasses the cascode BiMOS 1 through the Zener diode 2, to reach the downstream side CP$_2$ of the current path CP. The collector current serves as a reverse current for the bipolar transistor 21, to force the bipolar transistor 21 to turn off. As a result, all of the transistors 11, 12 and 21 are in their respective turning-off states, and the current path CP is opened in the cascode BiMOS 1, so that no current flow through the current path CP.

The Zener diode 2 clamps the base voltage level of the bipolar transistor 21 at the Zener breakdown voltage thereof, to prevent the base voltage level from falling down in the period in which the transistor 11 and 21 are in their respective conductive states.

As understood from the operation described above, the bipolar transistor 21 connected to the bipolar transistor 11 through the Darlington connection has a function similar to that of a transformer employed in the conventional drive circuit, and therefore, no transformer is required in the present invention. The Darlington connection is substantially disenabled in the respective turning off state of the bipolar transistors, since the reverse base currents flow through the diode 22 and the Zener diode 2 while bypassing the Darlington connection. In other words, the Darlington connection substantially functions only in the turn on period of the transistors, so that the turning off operation is secured.

The drive circuit according to the present invention needs no reactance, so that the switching speed thereof is improved. Since the bipolar transistor 11 and 21 turn off through the respective emitter cut off operation, the switching speed is further improved. When the bipolar transistor 11 and 21, the diode 22, the Zener diode 2, and the cascode BiMOS 1 are received in a common package, wiring length for connecting these elements with each other is decreased to further improve the switching speed. A degree of freedom in designing a device employing the present BiMOS drive circuit is increased, since no transformer is required. The present drive circuit requires no transformer, and therefore, the present drive circuit is superior to the conventional one in low cost and in low power loss.

Although the present invention has been described and illustrated in detail, it is clearly understood that the same is by way of illustration and example only and is not to be taken by way of limitation, the spirit and scope of the present invention being limited only by the terms of the appended claims.

We claim:

1. A drive circuit for driving a cascode bipolar-MOS circuit having a first bipolar transistor and a MOS transistor coupled to each other through a cascode connection or series, said bipolar-MOS circuit being inserted in a current path to open and close said current path in response to a control signal supplied from the exterior of said cascode bipolar-MOS circuit to a gate of said MOS transistor, said drive circuit comprising:

a second bipolar transistor coupled to said first bipolar transistor through a Darlington connection;

current supply circuit including a D.C. power source and a first capacitor connected in series through a connection node which is coupled to a base of said second bipolar transistor for supplying a base current to said base of said second bipolar transistor wherein said first capacitor supplies a discharge current as an over shoot current of said second bipolar transistor to turn on said second bipolar transistor;

a diode inserted between said base of said second bipolar transistor and a base of said first bipolar transistor for allowing a current to pass through said diode only in a direction from said base of said first bipolar transistor to said base of said second bipolar transistor; and a Zener diode having a cathode coupled to said base of said second bipolar transistor and an anode coupled to a source electrode of said MOS transistor.

2. A drive circuit in accordance with claim 1, further comprising a second capacitor inserted between said base of said first bipolar transistor and said source electrode.

3. A drive circuit in accordance with claim 2, wherein said first and second bipolar transistor are npn transistors, respective collectors of said first and second bipolar transistors are connected with each other, and an emitter of said second bipolar transistor is connected with said base of said first bipolar transistor.

4. A drive circuit in accordance with claim 3, wherein said current supply circuit having said power source coupled to said base of said second bipolar transistor through a resistance, and said first capacitor being inserted between said power source and said source electrode.

* * * * *